(12) United States Patent
Ye et al.

(10) Patent No.: US 10,054,859 B2
(45) Date of Patent: Aug. 21, 2018

(54) REAL-TIME VARIABLE PARAMETER MICRO-NANO OPTICAL FIELD MODULATION SYSTEM AND INTERFERENCE LITHOGRAPHY SYSTEM

(71) Applicant: Soochow University, Suzhou, Jiangsu (CN)

(72) Inventors: Yan Ye, Jiangsu (CN); Fengchuan Xu, Jiangsu (CN); Guojun Wei, Jiangsu (CN); Yishen Xu, Jiangsu (CN); Donglin Pu, Jiangsu (CN); Linsen Chen, Jiangsu (CN)

(73) Assignee: SOOCHOW UNIVERSITY, Suzhou (CN)

( * ) Notice: Subject to any disclaimer, the term of this patent is extended or adjusted under 35 U.S.C. 154(b) by 16 days.

(21) Appl. No.: 15/310,245

(22) PCT Filed: Jan. 6, 2016

(86) PCT No.: PCT/CN2016/070306
§ 371 (c)(1),
(2) Date: Nov. 10, 2016

(87) PCT Pub. No.: WO2017/117751
PCT Pub. Date: Jul. 13, 2017

(65) Prior Publication Data
US 2018/0039183 A1  Feb. 8, 2018

(51) Int. Cl.
*G03F 7/20* (2006.01)
*G02B 27/42* (2006.01)
(Continued)

(52) U.S. Cl.
CPC ........... *G03F 7/7045* (2013.01); *G02B 27/00* (2013.01); *G02B 27/0905* (2013.01);
(Continued)

(58) Field of Classification Search
CPC ........... G02B 27/0905; G02B 27/4222; G02B 27/0944; G02B 27/095; G02B 27/0977; G02B 27/0988; G03F 7/704
(Continued)

(56) References Cited

U.S. PATENT DOCUMENTS 5,132,812 A   7/1992  Takahashi et al.
5,262,879 A   11/1993  Davis
(Continued)

FOREIGN PATENT DOCUMENTS

CN   1350211 A   5/2002
CN   1786748 A   6/2006
(Continued)

*Primary Examiner* — William R Alexander
*Assistant Examiner* — Grant Gagnon
(74) *Attorney, Agent, or Firm* — SZDC Law P.C.

(57) ABSTRACT

A real-time variable parameter micro-nano optical field modulation system includes a light source, a 4F optical system and a set of light wave modulation optical components. The 4F optical system includes a first optical assembly and a second optical assembly arranged along an optical path in sequence. The light wave modulation optical components are arranged between the first optical assembly and the second optical assembly, and generate optical field distribution with adjustable patterns and structural parameters thereof on a back focal plane of the system by segmented modulation of sub-wavefronts.

10 Claims, 5 Drawing Sheets

(51) Int. Cl.
*G02B 27/09* (2006.01)
*G02B 27/00* (2006.01)

(52) U.S. Cl.
CPC ..... *G02B 27/4222* (2013.01); *G03F 7/70408* (2013.01); *G02B 27/095* (2013.01); *G02B 27/0944* (2013.01); *G02B 27/0977* (2013.01); *G02B 27/0988* (2013.01)

(58) Field of Classification Search
USPC .......................................................... 359/578
See application file for complete search history.

(56) References Cited

U.S. PATENT DOCUMENTS

| | | | |
|---|---|---|---|
| 5,822,092 A | 10/1998 | Davis | |
| 2002/0196549 A1* | 12/2002 | Randall | G02B 6/29358 359/578 |
| 2004/0258353 A1* | 12/2004 | Gluckstad | G02B 6/02347 385/28 |

FOREIGN PATENT DOCUMENTS

| | | |
|---|---|---|
| CN | 1786749 A | 6/2006 |
| CN | 101930207 A | 12/2010 |
| CN | 101976020 A | 2/2011 |
| CN | 102073264 A | 5/2011 |
| CN | 102576152 A | 7/2012 |
| CN | 103246195 A | 8/2013 |
| CN | 103488036 A | 1/2014 |
| WO | 2013102464 A1 | 7/2013 |

\* cited by examiner

REAL-TIME VARIABLE PARAMETER MICRO-NANO OPTICAL FIELD MODULATION SYSTEM AND INTERFERENCE LITHOGRAPHY SYSTEM

The present application is a national phase application of PCT/CN2016/070306, filed on Jan. 6, 2016, which is incorporated by reference for all purposes as if fully set forth herein.

TECHNICAL FIELD

The invention relates to a real-time variable parameter micro-nano optical field modulation system and an interference lithography system, and particularly to a variable parameter optical field modulation system where multiple sub-wavefronts are modulated separately and continuously in real time, which can be applied to micro-nano structure fabrication, laser confocal microscope, bioluminescence detection and micro-nano morphological detection.

BACKGROUND

Interference lithography or holographic lithography is a technique for efficiently fabricating a large-scale micro-nano structure, and the period of the micro-nano structure is determined by the wavelength and included angle of interference beams (the period is proportional to the wavelength and inversely proportional to the sine value of the included angle between the interference beams); the orientation of the micro-nano structure is determined by the wave vector of the interference beams; and the phase distribution of the fringe is determined by the relative phase difference of the interference beams. The interference lithography can be freely combined with other technologies such as vapor deposition, etching and so on, which provides a foundation for the application of micro-nano structures in photonic crystals, biomedicines, microelectronics and other fields.

The interference lithography system is classified into an amplitude-splitting interference system and a wavefront-splitting interference system, and the two systems split an incident light into two or more coherent beams for interference by a light-splitting device, which is usually selected from a half mirror, a prism, a grating, a diffractive mask and a Lloyd's mirror, etc. Regardless of which kind of light splitter, the structural parameters of the micro-nano structure are fixed, and cannot change in real time. Even with a gimbal mirror, the period of the micro-nano structure can only be changed in a limited range, but its corresponding optical setup is complex.

In order to achieve a spatial frequency modulation of the micro-nano structure, U.S. Pat. No. 5,132,812 and the improvement thereof U.S. Pat. No. 5,262,879, U.S. Pat. No. 5,822,092 and U.S. Pat. No. 5,132,812 use an interference of three sets of beams with different included angles to form three grating pixels with different spatial frequencies, realizing discrete modulation of the spatial frequencies of a grating. Chinese patents CN 01134127.0, CN 200510095775.2, CN 200510095776.2, CN 201010238377.2, and CN 201010503788.X disclose a method to achieve discrete modulation of the spatial frequencies by switching light-splitting gratings having different spatial frequencies, with a binary grating as a light-splitting element.

However, at present, for new materials based on the micro-nano structure, such as new color display, true color 3D display and metasurface material, there is a need for the lithography system to fabricate parameters such as period, orientation, duty cycle and even pattern in real time.

SUMMARY OF THE INVENTION

Objects of the present invention are to provide a real-time variable parameter micro-nano optical field modulation system and an interference lithography system, which can be flexibly integrated into various lithography systems to realize real-time fabrication of micro-nano structures, and can also be integrated into various microscopic systems to provide illumination of a modulatable structure.

In order to achieve the objects, the present invention proposes a technical solution as follows:

an embodiment of the present application discloses a real-time variable parameter micro-nano optical field modulation system, comprising a light source, a 4F optical system and a set of light wave modulation optical components, wherein the 4F optical system includes a first optical assembly and a second optical assembly arranged in sequence along an optical path. The light wave modulation optical components are arranged between them, and generates optical field distribution with adjustable patterns and structural parameters thereof on a back focal plane of the system by segmented modulation of sub-wavefronts.

In this technical solution, the first optical assembly and the second optical assembly may be either a single lens or a combination of a plurality of lenses.

Preferably, in said real-time variable parameter micro-nano optical field modulation system, the structural parameters comprise a period, an orientation, a phase or phase shift, and a duty cycle.

Preferably, in said real-time variable parameter micro-nano optical field modulation system, the optical field distribution is an interference pattern.

Preferably, in said real-time variable parameter micro-nano optical field modulation system, the structural parameters are continuously adjustable in real time, separately or synchronously.

Preferably, in said real-time variable parameter micro-nano optical field modulation system, the first optical assembly and the second optical assembly are lenses, lens sets or metasurface devices and micro-nano structures with the same optical performance.

Preferably, in said real-time variable parameter micro-nano optical field modulation system, the set of light wave modulation optical components comprises a plurality of sub-elements, by selecting different sub-elements or/and different combinations, this system realizes the modulation of different optical fields of the respective sub-wavefronts, and generates the optical field distribution of different patterns on the back focal plane of the system; and the sub-elements realize the optical field modulation of the respective sub-wavefronts by means of changes in displacement and/or rotation, and generate the optical field distribution with adjustable structural parameters on the back focal plane of the system.

In this technical solution, the sub-elements can be modulated separately or in real time for different sub-wavefronts, and the movements of the sub-elements can be completed by a computer together with a precise control system.

In this technical solution, the sub-element can be any periodic or aperiodic structure.

Preferably, in said real-time variable parameter micro-nano optical field modulation system, the sub-elements are selected from the group consisting of phase elements, binary optical elements, grating elements, holographic elements, reflective elements, refractive elements and metasurface elements.

Preferably, in said real-time variable parameter micro-nano optical field modulation system, the set of light wave modulation optical components comprises multiple stages of subsets of devices in the direction of the optical path, each of said stages comprising at least one sub-element, wherein the subset of devices located at the next stage is used for real-time modulation of the sub-wavefront of the wavefront that is modulated in the previous stage.

In this technical solution, the modulation here refers to the change of beam path of the sub-wavefronts by the movement and/or rotation of the sub-elements.

Preferably, in said real-time variable parameter micro-nano optical field modulation system, the set of optical components can also comprise one or more combinations of an adjustable diaphragm, a gray-scale mask, and a polarization conversion element.

Preferably, in said real-time variable parameter micro-nano optical field modulation system, the light source comprises a laser. Further, the light source is provided by a laser or another coherent light source. The incident lights generated thereby are parallel.

An embodiment of the present application further discloses an interference lithography system for a micro-nano structure, comprising the real-time variable parameter micro-nano optical field modulation system.

In this technical solution, the different modulated sub-wavefronts form multiple beams on the back focal plane of the 4F optical system, and the different beams can interfere with each other, can superimpose each other, or can interfere and superimpose simultaneously in overlapping regions.

The micro-nano optical field modulation system can also be flexibly integrated into a variety of microscopic systems.

Compared with the prior art, the present invention has the advantages as follows:

(1) the fabrication of different patterns is achieved by means of a combination of different separate sub-elements. The fabrication of pixelated patterns is achieved by combining spatial filtering equipment and precise control platform.

(2) the structural parameters of a multi-dimensional pattern in different dimensions can be separately adjusted by modulating the sub-elements respectively.

(3) the continuous modulation of the structural parameters of a pattern in a single dimension can be achieved by means of the translation and rotation of the sub-elements.

In summary, different sub-elements are used to form a set of optical modulation devices in the present invention, real-time segmented modulation of sub-wavefronts of an incident light is achieved, and combined modulation methods such as segmented modulation is implemented for the modulated sub-wavefronts, so as to fabricate various complex micro-nano structures in real time, and to adjust the structural parameters continuously in real time.

BRIEF DESCRIPTION OF FIGURES

In order to illustrate the embodiments of the present application or the technical solutions in the prior art more clearly, the figures required for use in the description of the embodiment or the prior art will be simply introduced below; obviously, the figures described below are merely some of the embodiments recorded in the present application, and for a person skilled in the art, other figures may be also obtained according to these figures without involving any inventive effort.

DETAILED DESCRIPTION

The technical solution of the embodiment of the present invention will be described in detail below in conjunction with the accompanying drawings of the embodiment of the present invention, and obviously, the described embodiment is merely some rather than all of the embodiments of the present invention. On the basis of the embodiment of the present invention, all other embodiments obtained by a person skilled in the art without any inventive effort shall fall within the scope of protection of the present invention.

First Embodiment: Real-Time Variable Parameter Optical Field Modulation System Based on Separate Modulation of Two Segments of Sub-Wavefronts In this embodiment, the real-time variable parameter micro-nano optical field modulation system is shown in FIG.

1; in a 4F optical system, a sub-element 13 and a sub-element 14 constitute a set of light wave modulation optical components, at least one of them is a binary optical element, a grating element, a holographic element or a metasurface element; the sub-element 13 and the sub-element 14 may be either a periodic structure or an aperiodic structure; the sub-element 13 and the sub-element 14 may be identical or different.

In the present embodiment, if the sub-elements 13 and 14 are a binary optical element and a hologram element respectively for eliminating the $0^{th}$ diffraction, and the sub-elements 13 and 14 have $\pm 1^{st}$ diffracted lights, then convergent beam after the first lens (set) 1 passes through the sub-element 13 and the sub-element 14, and the $\pm 1^{st}$ diffracted lights form two symmetrical converged beam spots on the back focal plane of the first lens (set) of the 4F optical system respectively, i.e., four converged beam spots are formed on the back focal plane of the first lens (set). In the absence of other secondary optical elements, if the aperture of the second lens (set) 2 is not large enough, only the $+1^{st}$ diffracted light of the sub-element 13 and the $-1^{st}$ diffracted light of the sub-element 14 enter the second lens (set), then two beams interfere with each other on the back focal plane of the second lens (set).

Figure 1:
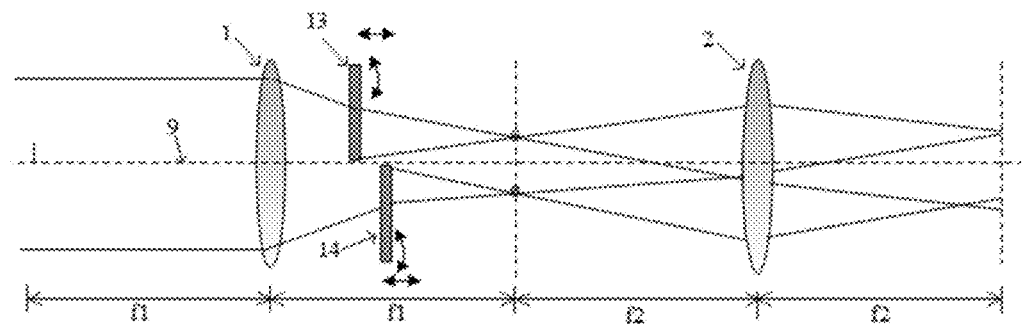
FIG. 1 shows a real-time variable parameter optical field modulation system based on separate modulation of two segments of sub-wavefronts in the first embodiment of the present invention.
Figure 2:
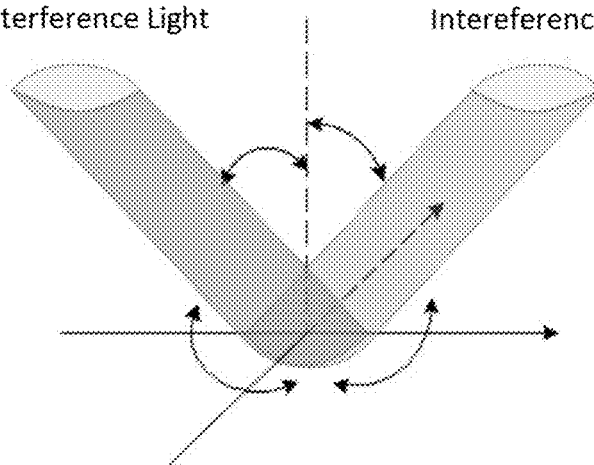
FIG. 2 is a schematic view showing an interference of two beams on a back focal plane of a 4F optical system in the first embodiment of the present invention.

As shown in FIG. 2, in which the dashed line represents an optical axis 9 of the 4F optical system. The two beams in FIG. 2 correspond to the $+1^{st}$ transmitted optical field of the element 13 and the $-1^{st}$ transmitted optical field of the element 14 respectively under the condition that parallel lights are incident in the normal direction. Therefore, the use of different sub-elements will form different interference patterns on the back focal plane of the second lens (set).

In the present embodiment, if the element 13 or 14 is translated, the included angle between the corresponding output beam in FIG. 2 and the optical axis will change, thus changing the period of the output patterns; and if the element rotates around its own center, the corresponding output beam in FIG. 2 will rotate around the optical axis, thus changing the orientation of the output patterns.

Figure 3:
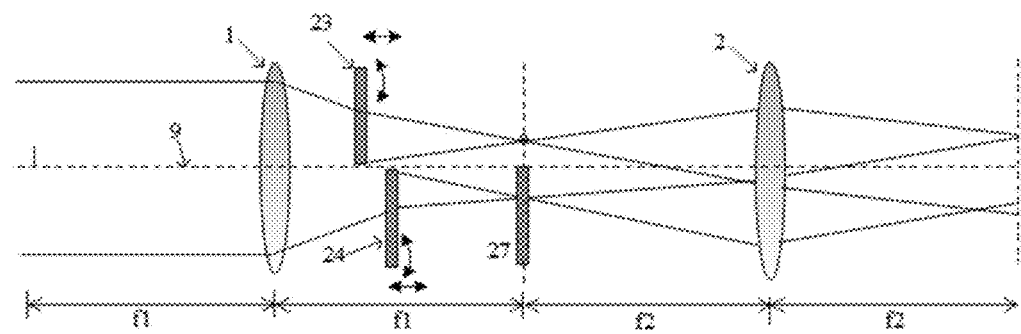
FIG. 3 shows a real-time variable parameter optical field modulation system in a second embodiment of the present invention, in which a phase retarder is inserted for segmented modulation of sub-wavefronts.
Figure 4:
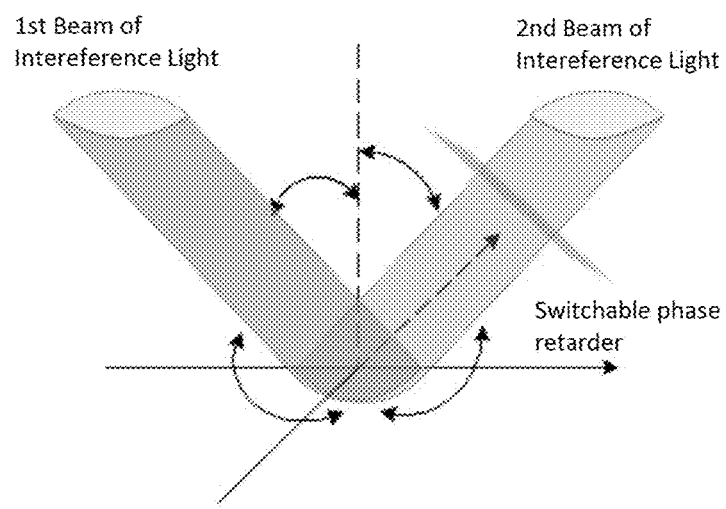
FIG. 4 is a schematic view showing the principle of phase shift in two-beam interference on a back focal plane of a 4F optical system in the second embodiment of the present invention.

Second Embodiment: Real-Time Variable Parameter Optical Field Modulation System in which a Phase Retarder is Inserted for Segmented Modulation of Sub-Wavefronts In this embodiment, the real-time variable parameter micro-nano optical field modulation system is shown in FIG. 3; in a 4F optical system, sub-elements 23 and 24 constitute a set of light wave modulation optical components, and a sub-element 27 is a switchable phase retarder. If both the sub-element 23 and 24 are binary optical elements in which only $\pm 1^{st}$ diffracted lights exist, then two beams interfere with each other on the back focal plane of the second lens (set), as shown in FIG. 4, and the beam corresponding to sub-element 24 generates a different phase delay under the action of the sub-element 27. In the present embodiment, the transmitted and diffracted lights of the sub-elements 23, 24 are parallel in the case where parallel lights are incident in the normal direction, accordingly, the two beams in FIG. 4 are parallel, and the interference pattern is a one-dimensional fringe; the phase difference between the two light beams changes with the adjustment of the element 27, and the phase shift of the resulting one-dimensional fringe occurs accordingly.

Figure 5:
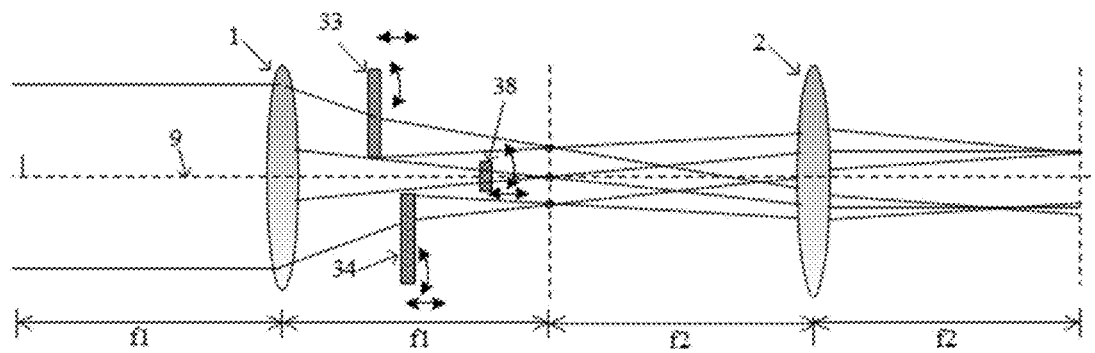
FIG. 5 shows a real-time variable parameter optical field modulation system based on separate modulation of three segments of sub-wavefronts in the third embodiment of the present invention.

Third Embodiment: Real-Time Variable Parameter Optical Field Modulation System Based on Separate Modulation of Three Segments of Sub-Wavefronts In this embodiment, the real-time variable parameter micro-nano optical field modulation system is shown in FIG. 5; in a 4F optical system, sub-elements 33, 34 and 38 constitute a set of light wave modulation optical components, convergent light after the first lens (set) 1 is divided into three segments of sub-waves to be modulated respectively, at least one of the sub-elements 33, 34 and 38 is a binary optical element, a grating element, a holographic element or a metasurface element; the sub-elements 33, 34 and 38 may be either a periodic structure or an aperiodic structure; and the sub-elements 33, 34 and 38 may be identical or different.

Figure 6:
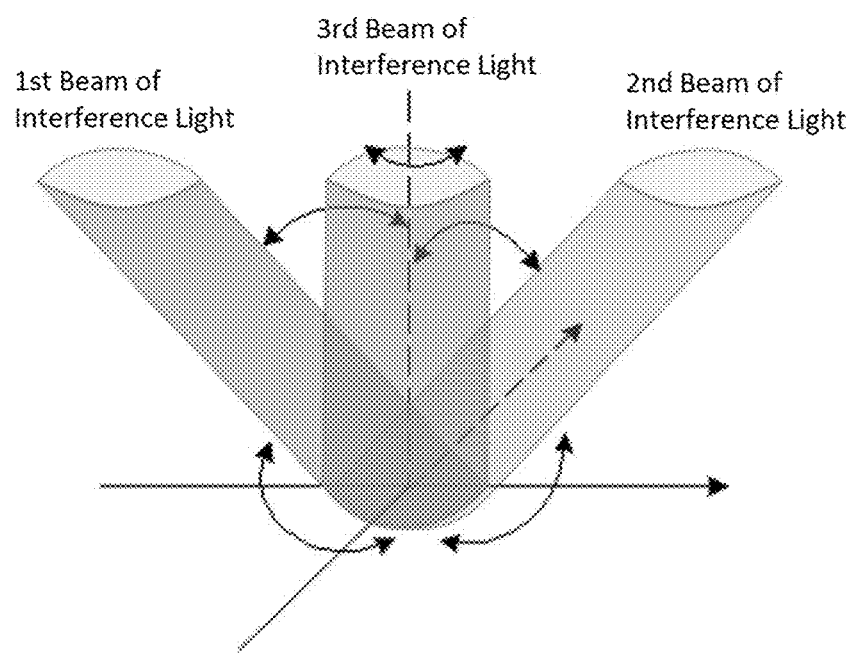
FIG. 6 is a schematic view showing an interference of three beams on a back focal plane of a 4F optical system in the third embodiment of the present invention.

In this embodiment, if the sub-element 33 is a grating element, the sub-element 34 is a holographic element, and the sub-element 38 is a metasurface element, wherein back surfaces of the sub-elements 33 and 34 are closely adjacent to a mask to eliminate the $0^{th}$ light, only a $0^{th}$ diffracted light is present at the sub-element 38. Then Three beams are formed on the back focal plane of the second lens (set), as shown in FIG. 6, where the beam 3 corresponds to a modulated spectrum after passing through the metasurface element, and the beam 3 is always aligned with the optical axis regardless of how the sub-element 38 is translated; and if the sub-element 38 rotates around its own center, the light beam 3 will rotate around the optical axis. The translation of the sub-elements 33, 34 will change the included angles between the beams 1, 2 and the optical axis respectively; when the sub-elements 33, 34 rotates around their own centers, the corresponding beam 1 and beam 2 will rotate around the optical axis by a respective angle; and when the sub-elements 33, 34 rotates around the optical axis simultaneously, the corresponding beam 1, 2 will also rotate around the optical axis simultaneously.

If the sub-element 33 is a one-dimensional grating, the $+1^{st}$ transmitted and diffracted lights thereof are parallel in the case where parallel lights are incident in the normal direction; the $-1^{st}$ transmitted and diffracted lights of the sub-element 34 exhibit a leaf-shaped intensity distribution in the case where parallel lights are incident in the normal direction, and the $0^{th}$ transmitted lights of the sub-element 38 exhibit a spiral-shaped optical field distribution in the case where parallel lights are incident in the normal direction, then FIG. 6 shows the mutual interference of parallel lights with uniform optical fields, parallel lights with optical fields distributed in the shape of a leaf and parallel lights with helically distributed optical fields, respectively.

Figure 7:
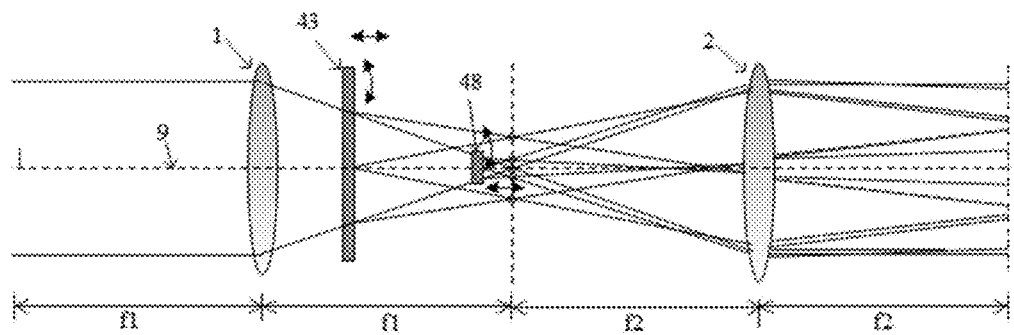
FIG. 7 shows a real-time variable parameter optical field modulation system based on remodulation of sub-wavefronts after modulation thereof in the fourth embodiment of the present invention.

Fourth Embodiment: Real-Time Variable Parameter Optical Field Modulation System Based on Remodulation of Modulated Sub-Wavefronts In this embodiment, the real-time variable parameter micro-nano optical field modulation system is shown in FIG. 7; in a 4F optical system, sub-elements 43 and 48 constitute a set of light wave modulation optical components, the sub-element 43 modulates the convergent beam after the first lens (set), and the sub-element 48 modulates the sub-wavefronts of the wavefront modulated by the sub-element 43. At least one of the sub-element 43 and 48 is a binary optical element, a grating element, a holographic element or a metasurface element.

Figure 8:
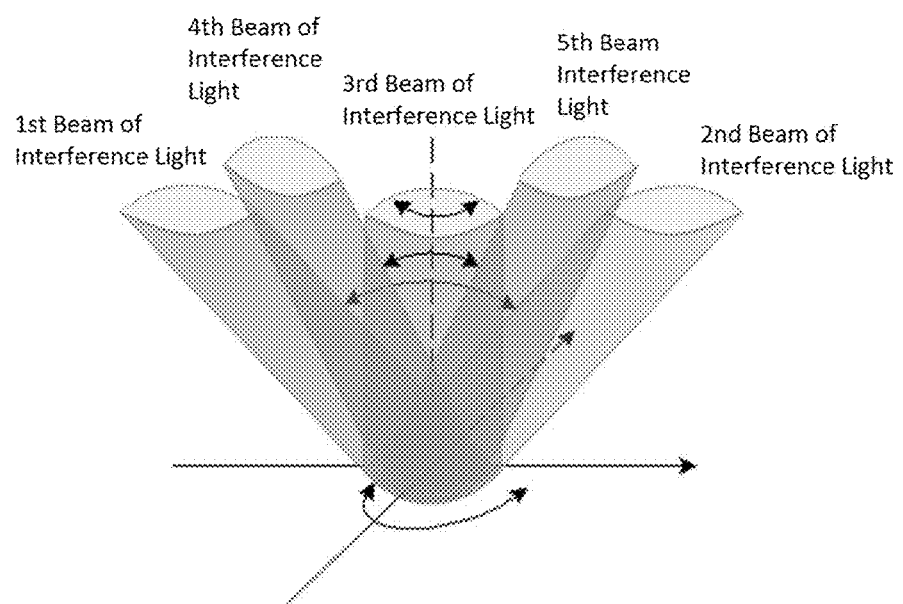
FIG. 8 is a schematic view showing an interference of five beams after two stages of modulations on a back focal plane of a 4F optical system in the fourth embodiment of the present invention.

In this embodiment, if the sub-element 43 is a multi-stage transmissive one-dimensional grating and the sub-elements 48 is a multi-stage transmissive metasurface device, the convergent light after the first lens (set) passes through the sub-element 43 and then generates $0^{th}$, and $\pm1^{st}$ diffracted lights, wherein the $\pm1^{st}$ diffracted lights are converged on the back focal plane of the first lens (set), and the $0^{th}$ light passes through the sub-element 48 to form three beams of convergent lights. Five groups of light rays pass through the second lens (set) and generate the mutual interference as shown in FIG. 8, wherein the light beam 3 corresponds to the $0^{th}$ diffracted light of the sub-elements 48 in the case that parallel lights are incident in the normal direction, and the beams 1, 2 correspond to the $\pm1^{st}$ diffracted lights of the sub-element 43 in the case that parallel lights are incident in the normal direction, and the beams 4, 5 correspond to the $\pm1^{st}$ diffracted lights of the sub-elements 48 in the case that parallel lights are incident in the normal direction. In this embodiment, when the sub-element 48 is translated, the beam 3 is always parallel to the optical axis of the 4F optical system, and the included angles between the beams 4, 5 and the optical axis change synchronously; and when the sub-element 43 is translated, the included angles between the beams 1, 2 and the optical axis change synchronously. If the sub-element 48 rotates, the beams 3, 4, and 5 will rotate around the optical axis by the respective angles; and if the sub-element 43 rotates, the beams 1, 2 will also rotate around the optical axis simultaneously.

Thus, in this embodiment, the sub-element 43 and 48 constitute two sets of optical modulation devices. The sub-element 43 is directed to the modulation of the incident light wave, and the sub-element 48 is directed to the modulation of sub-wavefronts of the modulated light wave.

Figure 9:
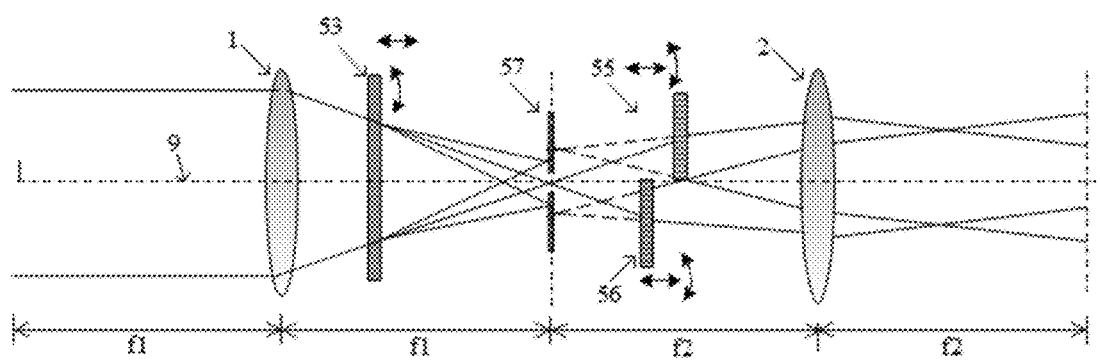
FIG. 9 shows a real-time variable parameter optical field modulation system based on segmented remodulation of sub-wavefronts after modulation thereof in the fifth embodiment of the present invention.

Fifth Embodiment: Real-Time Variable Parameter Optical Field Modulation System Based on Segmented Remodulation of Modulated Sub-Wavefronts In this embodiment, the real-time variable parameter micro-nano optical field modulation system is shown in FIG. 9, in a 4F optical system, sub-elements 53, 55 and 56 constitute a set of light wave modulation optical components, the sub-element 53 modulates the convergent beam after the first lens (set), the higher-order transmitted light is blocked by a spatial filtering sub-element 57, and the sub-elements 55 and 56 modulate the sub-wavefronts of the wavefront modulated by the sub-element 53. At least one of the sub-elements 53, 55 and 56 is a binary optical element, a grating element, a holographic element or a metasurface element.

If the sub-element 53 is a hologram element, and the sub-elements 55 and 56 are binary optical elements for eliminating the $0^{th}$ light, and if the higher-order diffracted light of sub-elements 53 is blocked by the sub-element 57, convergent light after the first lens (set) passes through the sub-element 53 and converges on a back focal point of the first lens (set) and then diverges into the sub-element 55 and 56; and the reverse extension lines of the diffracted lights of the sub-element 55 and the sub-element 56 converged on the back focal plane of the first lens (set). In the absence of other secondary optical elements and the aperture of the second lens (set) is not large enough, only the $-1^{st}$ diffracted lights of the sub-element 55 and $+1^{st}$ diffracted lights of the sub-element 56 pass through the second lens (set) to the back focal plane of the 4F optical system, forming two beams of interference lights as shown in FIG. 2. In the present embodiment, the beam 1 and beam 2 correspond to the $0^{th}$ diffracted lights of the sub-element 53 respectively in the case that parallel lights are incident in the normal direction. If the sub-element 53 rotates, the beams 1, 2 will rotate around the optical axis of the 4F optical system; if the sub-elements 55, 56 rotate around their own centers respectively, the beams 1, 2 will rotate around the optical axis by the respective angles; and if the sub-elements 55, 56 rotate around the optical axis simultaneously, the beams 1, 2 will also rotate around the optical axis simultaneously by the respective angles.

Figure 10:
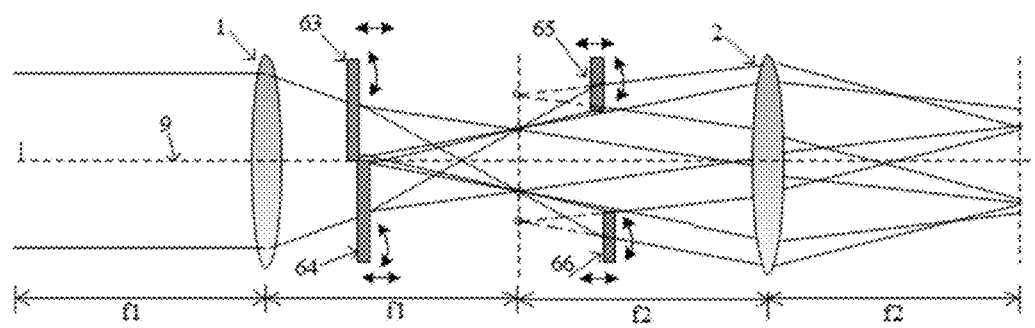
FIG. 10 shows a real-time variable parameter optical field modulation system based on segmented remodulation of sub-wavefronts after segmented modulation thereof in the sixth embodiment of the present invention.

Sixth Embodiment: Real-Time Variable Parameter Optical Field Modulation System Based on Segmented Remodulation of Modulated Sub-Wavefronts In this embodiment, the real-time variable parameter micro-nano optical field modulation system is shown in FIG. 10; in a 4F optical system, a sub-element 63 and 64, and sub-elements 65 and 66 constitute two sets of light wave modulation optical components, the sub-elements 63 and 64 modulate the convergent beam after the first lens (set), and the sub-elements 65 and 66 modulate the sub-wavefronts of the wavefront modulated by the previous set of optical elements. At least one of the sub-elements 63, 64, 65 and 66 is a binary optical element, a grating element, a holographic element or a metasurface element.

Figure 11:
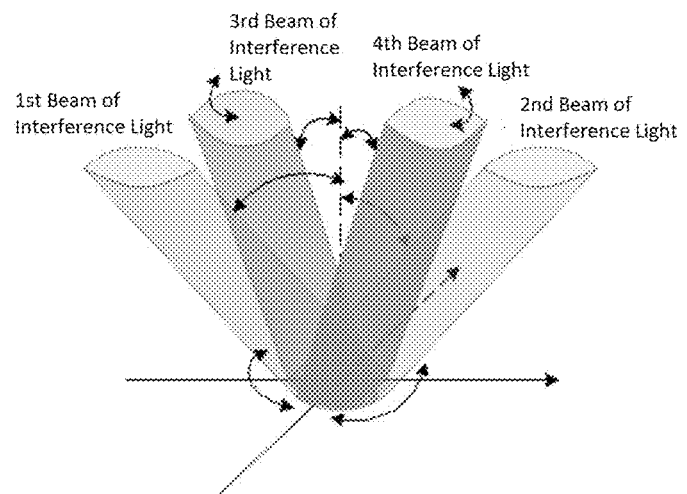
FIG. 11 is a schematic view showing an interference of four beams after two stages of modulations on a back focal plane of a 4F optical system in the sixth embodiment of the present invention.

If all the sub-elements 63, 64, 65 and 66 are binary phase elements for eliminating the $0^{th}$ light, convergent light passes through the sub-elements 63, 64 to form four convergent light spots on the back focal plane of the first lens (set), and the $+1^{st}$ diffracted light of the sub-element 63 and the $-1^{st}$ diffracted light of the sub-element 64 are directly incident onto the second lens (set); and the $-1^{st}$ diffracted light of the sub-elements 63 is modulated by the sub-element 66 and then incident onto the second lens (set); and the $+1^{st}$ diffracted light of the sub-elements 64 is modulated by the sub-element 65 and then incident onto the second lens (set). Four interference beams, as shown in FIG. 11, are formed on the back focal plane of the 4F optical system, and in this embodiment, the four beams are all parallel beams with evenly distributed optical fields. When the sub-elements 63, 64, 65, 66 are translated respectively, the included angles between the corresponding beams and the optical axis will change; when the sub-elements 63, 64, 65, 66 rotate around their own centers respectively, the corresponding beams will rotate around the optical axis; and when the sub-elements 63, 64, 65, 66 rotate around the optical axis at the same time, four beams of light will rotate around the optical axis simultaneously.

As shown in FIG. 11, the four beams may interfere in the same interference plane, or interfere with each other in two mutually perpendicular planes, and the optical fields of the interference lights are superposed geometrically.

Figure 12:
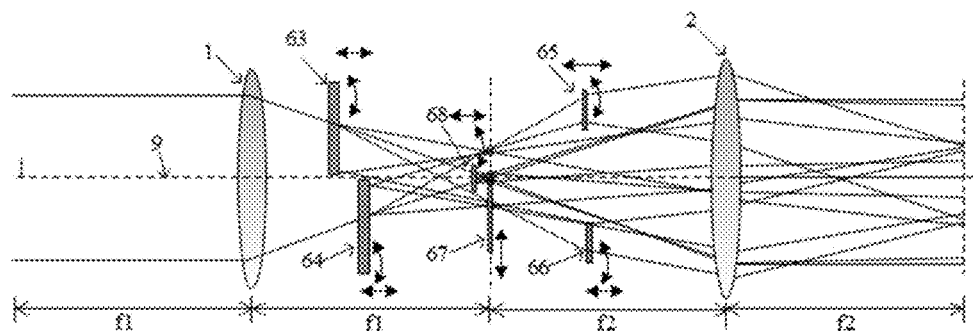
FIG. 12 is a schematic view showing an interference of seven beams after two stages of modulations on a back focal plane of a 4F optical system in the sixth embodiment of the present invention.

If the sub-elements 63 and 64 do not eliminate the $0^{th}$ light, and the $0^{th}$ light thereof is modulated by the sub-element 68, as shown in FIG. 12, and $0^{th}$ and higher-order transmissions occurs at the sub-element 68, then there are at least seven sub-wavefronts after the sub-element 68, wherein part of the wavefront modulated by the sub-elements 63 and 64 are remodulated by the sub-elements 65 and 66, the sub-wavefronts below the optical axis are remodulated by the sub-element 67, and finally at least seven interference beams are formed on the back focal plane of the 4F optical system; and if the sub-element 67 is a phase delay device, the phase of the interference pattern will shift with different phase delay of the sub-element 67.

In the above embodiment, the incident light of the 4F optical system is parallel to the optical axis, and relative to the optical axis when the incident light has an included angle, the light wave after passing through the previous optical modulation device still converges on back focal plane of the first lens (set), and only the positions of the convergent light spots are translated in the incident light direction.

The embodiments of the real-time variable parameter micro-nano optical field modulation system is not limited to the above embodiments; the modulation sub-elements constituting the set of optical devices are not limited to the aforementioned optical elements; the sub-elements may be of a one-dimensional or multidimensional periodic or aperiodic structure; and incident lights of the 4F optical system are parallel lights, but are not limited to parallel lights.

In summary, the system of the present invention uses a laser to be the light source, uses a 4F optical system and separate optical modulation devices to generate interference patterns with real-time continuously adjustable structural parameters such as a period, an orientation and a duty cycle, is integrated in a variety of lithography systems, fabricates micro-nano patterns with different structural parameters on positive and negative photoresist surfaces in real time, and provides the basis for the new functional material based on the micro-nano structure.

It should be noted that the use of relational terms herein, such as first and second and the like, are used solely to distinguish one entity or action from another without necessarily requiring or implying any actual relationship or order between such entities or actions. Furthermore, the terms "comprises," "comprising," or any variation thereof, are intended to cover a non-exclusive inclusion, such that a process, method, article, or apparatus that comprises a list of elements does not include only those elements but may include other elements not expressly listed or inherent to such process, method, article, or apparatus. Where no other restrictions are stated, the elements defined by the phrase "comprising a" do not exclude the presence of additional identical elements in a process, method, article, or apparatus that includes said elements.

While the foregoing is only specific embodiments of the present application, it should be noted that modifications and adaptations may be made by those skilled in the art without departing from the principles of the present application, and should be considered to be within the scope of protection of the present application.

What is claimed is:

1. A real-time variable parameter micro-nano optical field modulation system, comprising:
   a coherent light source that generates parallel lights,
   a 4F optical system, and
   a set of light wave modulation optical components,
   wherein the 4F optical system includes a first optical assembly and a second optical assembly arranged along an optical path in sequence;
   wherein the light wave modulation optical components are arranged between the first optical assembly and the second optical assembly, and generate an optical field distribution with adjustable patterns and structural parameters thereof on a back focal plane of the system by segmented modulation of sub-wavefronts; and
   wherein the light wave modulation optical components comprise a plurality of sub-elements, for realizing the optical field modulation of the sub-wavefronts by selecting different sub-elements and/or different combinations thereof, and generate the optical field distribution of different patterns on the back focal plane of the system; and the sub-elements realize the optical field modulation of the respective sub-wavefronts by means of changes in displacement and/or rotation, and generate the optical field distribution with adjustable structural parameters on the back focal plane of the system.

2. The real-time variable parameter micro-nano optical field modulation system according to claim 1, wherein the structural parameters comprise a period, an orientation, a phase or phase shift amount, and a duty cycle.

3. The real-time variable parameter micro-nano optical field modulation system according to claim 1, wherein the optical field distribution is an interference pattern.

4. The real-time variable parameter micro-nano optical field modulation system according to claim 1, wherein the structural parameters are continuously adjustable in real time, separately or synchronously.

5. The real-time variable parameter micro-nano optical field modulation system according to claim 1, wherein the first optical assembly and the second optical assembly are lenses, lens sets or metasurface and micro-nano structures which have the same optical performance.

6. The real-time variable parameter micro-nano optical field modulation system according to claim 1, wherein the sub-elements are selected from the group consisting of phase elements, binary optical elements, grating elements, holographic elements, reflective elements, refractive elements and metasurface elements.

7. The real-time variable parameter micro-nano optical field modulation system according to claim 1, wherein the set of light wave modulation optical components comprises multiple stages of subsets of devices in the direction of the optical path, each of said stages comprising at least one of the sub-elements, wherein the subset of devices located at the next stage is used for real-time modulation of the sub-wavefront of the wavefront that is modulated in the previous stage.

8. The real-time variable parameter micro-nano optical field modulation system according to claim 1, wherein the set of optical components further comprises one or more combinations of an adjustable diaphragm, a gray-scale mask, and a polarization conversion element.

9. The real-time variable parameter micro-nano optical field modulation system according to claim 1, wherein the light source comprises a laser.

10. An interference lithography system for a micro-nano structure, comprising the real-time variable parameter micro-nano optical field modulation system according to claim 1.

* * * * *